(12) United States Patent
Roh et al.

(10) Patent No.: US 10,133,627 B2
(45) Date of Patent: Nov. 20, 2018

(54) MEMORY DEVICE CONTROLLER WITH MIRRORED COMMAND AND OPERATING METHOD THEREOF

(71) Applicant: SK hynix Inc., Gyeonggi-do (KR)

(72) Inventors: Young Dong Roh, Gyeonggi-do (KR); Se Chun Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 16 days.

(21) Appl. No.: 14/966,685

(22) Filed: Dec. 11, 2015

(65) Prior Publication Data

US 2017/0168892 A1 Jun. 15, 2017

(51) Int. Cl.
*G06F 11/10* (2006.01)
*G06F 3/06* (2006.01)
*G11C 29/52* (2006.01)
*G06F 11/32* (2006.01)

(52) U.S. Cl.
CPC .......... *G06F 11/1068* (2013.01); *G06F 3/061* (2013.01); *G06F 3/0619* (2013.01); *G06F 3/0659* (2013.01); *G06F 3/0679* (2013.01); *G11C 29/52* (2013.01)

(58) Field of Classification Search
CPC .... G06F 11/1068; G06F 3/061; G06F 3/0679; G06F 3/0619; G06F 3/0659; G11C 29/52
See application file for complete search history.

(56) References Cited

U.S. PATENT DOCUMENTS

| 7,093,071 B2 | 8/2006 | Rudelic | |
| 2003/0145151 A1* | 7/2003 | Matsushita | G11C 16/10 711/5 |
| 2007/0255905 A1 | 11/2007 | Morrow | |
| 2007/0283100 A1* | 12/2007 | Asano | G06F 12/084 711/125 |
| 2008/0080267 A1* | 4/2008 | Lee | G11C 7/1051 365/191 |
| 2008/0205136 A1* | 8/2008 | Wang | G06F 11/1072 365/185.03 |
| 2008/0270730 A1* | 10/2008 | Lasser | G06F 12/0246 711/170 |
| 2014/0164867 A1* | 6/2014 | Kaynak | G06F 11/10 714/763 |
| 2014/0208182 A1* | 7/2014 | Sakai | H03M 13/1117 714/755 |
| 2014/0244788 A1* | 8/2014 | Resch | H04L 67/1097 709/217 |

FOREIGN PATENT DOCUMENTS

KR 100626392 9/2006

OTHER PUBLICATIONS

Editor: Valerie Illingworth for Market House Books, The Penguin Dictionary of Electronics, 1998, Penguin Group, Third Edition, pertinent pp. 100, 349.*

* cited by examiner

*Primary Examiner* — Cynthia Britt
*Assistant Examiner* — Dipakkumar B Gandhi
(74) *Attorney, Agent, or Firm* — IP & T Group LLP

(57) ABSTRACT

A controller includes a command generation unit suitable for generating a first read command for at least one page selected from said plurality of pages, an error correction block suitable for performing a first error correction operation to one or more code words stored in said at least one selected page in response to the first read command, and a command mirroring unit suitable for generating a mirrored command by mirroring the first read command.

16 Claims, 10 Drawing Sheets

MEMORY DEVICE CONTROLLER WITH MIRRORED COMMAND AND OPERATING METHOD THEREOF

BACKGROUND

Field of Invention

Various exemplary embodiments relate generally to an electronic device, and more particularly to a controller for a semiconductor memory device and an operating method thereof.

Description of Related Art

Semiconductor memory devices are storage devices made of semiconductor materials such as silicon (Si), germanium (Ge), gallium arsenide (GaAs), and indium phosphide (Inp). Semiconductor memory devices may be classified into volatile and non-volatile memory devices.

Volatile memory devices generally lose stored data when powered off. Examples of volatile memory devices include Static RAM (SRAM), Dynamic RAM (DRAM) and Synchronous DRAM (SDRAM). Non-volatile memory devices retain stored data regardless of power on/off conditions. Examples of non-volatile memory devices include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memory devices may be classified into NORand NAND type depending upon the type of logic gate employed.

SUMMARY

Various embodiments are directed to a controller for controlling the operation of a semiconductor memory device, a memory system comprising the controller and at least one semiconductor memory device and an operating method thereof. The memory system and controller exhibit, inter alia, improved operating speed. Other advantages of the embodiments of the invention will become apparent to persons skilled in this art after having read the present disclosure.

According to an embodiment, a controller is provided for controlling a semiconductor memory device including a plurality of pages. The controller may include a command generation unit suitable for generating a first read command for at least one page selected from said plurality of pages an error correction block suitable for performing a first error correction operation to one or more code words stored in said at least one selected page in response to the first read command, and a command mirroring unit suitable for generating a mirrored command by mirroring the first read command.

The command mirroring unit may be suitable for generating a second read command when the error correction to at least one of said one or more code words fails.

The controller may be suitable for communicating the second read command to the semiconductor memory device and the error correction block is suitable for performing the error correction operation to at least one of said one or more code words in response to the second read command.

The second read command may be output to the semiconductor memory device, and the error correction block may be configured to perform the error correction on a code word corresponding to the second read command when the code word corresponding to the second read command is received from the semiconductor memory device.

When the error correction operation to each of the one or more code words passes, the command generation unit may provide error-corrected code words to a host The controller may include a main command queue suitable for queueing and dequeueing the first read command on a first-in-first-out (FIFO) basis, a mirroring storage unit suitable for storing the mirrored command, and a sub-command queue suitable for queueing and dequeueing the second read command on the FIFO basis.

The controller may include a command selection unit suitable for providing one of the first and second read commands of the main command queue and the sub-command queue to the semiconductor memory device.

The mirrored command in the mirroring storage unit is canceled when the error correction operation to each of said one or more the code words passes.

The second read command may be a read command for the code word, to which the error correction operation in response to the first read command fails.

The second read command may be a read command for the selected page.

The second read command may include a series of sub-commands for one or more read-retry operations to at least one or more of the code words, to which the error correction operation in response to the first read command fails.

The second read command may include a series of sub-commands for one or more soft decision operations to the code word, to which the error correction operation ire response to the first read command fails.

The controller may include a memory control unit suitable for providing the first and second read commands to the semiconductor memory device and receiving the code words corresponding to the first and second read commands from the semiconductor memory device, respectively.

According to another embodiment, an operating method for a controller controlling a semiconductor memory device including a plurality of pages may include generating a first read command for at least one page selected from said plurality of pages, performing error correction operation to at least one or more code words stored in the selected page in response to the first read command, and generating a mirrored command by mirroring the first read command.

A second read command may be generated on the basis of a mirrored command generated when the error correction operation to at least one of the code words fails.

The operating method may include providing error-corrected code words to a host when the error correction operation to each of the code words passes.

The operating method may further include canceling the mirrored command when the error correction operation to each of the code words passes.

The operating method may further include performing the error correction operation to at least one of said one or snore code words in response to the second read command.

The second read command may be a read command for the code word, to which the first error correction operation in response to the first read command fails.

The second read command may be a read command for the selected page.

The second read command may include a series of sub-commands for one or more read-retry operations to the code word to which the error correction operation in response to the first read command fails.

The second read command may include a series of sub-commands for one or more soft decision operations to at least one or more code words, to which the error correction operation in response to the first read command fails.

According to another embodiment, a memory system may include a semiconductor memory device including a plurality of pages, and a controller controlling the semiconductor memory device, wherein the controller comprises: an error correction block suitable for performing an error correction operation to each of code words stored in a selected page in response to a first read command; and a command mirroring unit suitable for generating a mirrored command by mirroring the first read command, wherein the command mirroring unit generates a second read command on the basis of the mirrored command when the error correction operation to at least one of the code words fails.

DETAILED DESCRIPTION

Hereinafter, various examples of embodiments will be described in detail with reference to the accompanying Figures. The Figures are examples of the invention provided to allow those with ordinary skill in the art to understand the invention. It should be understood, however, that the invention may be practiced in different forms and should not be construed as being limited to the particular embodiments set forth in the Figures.

Figure 1:
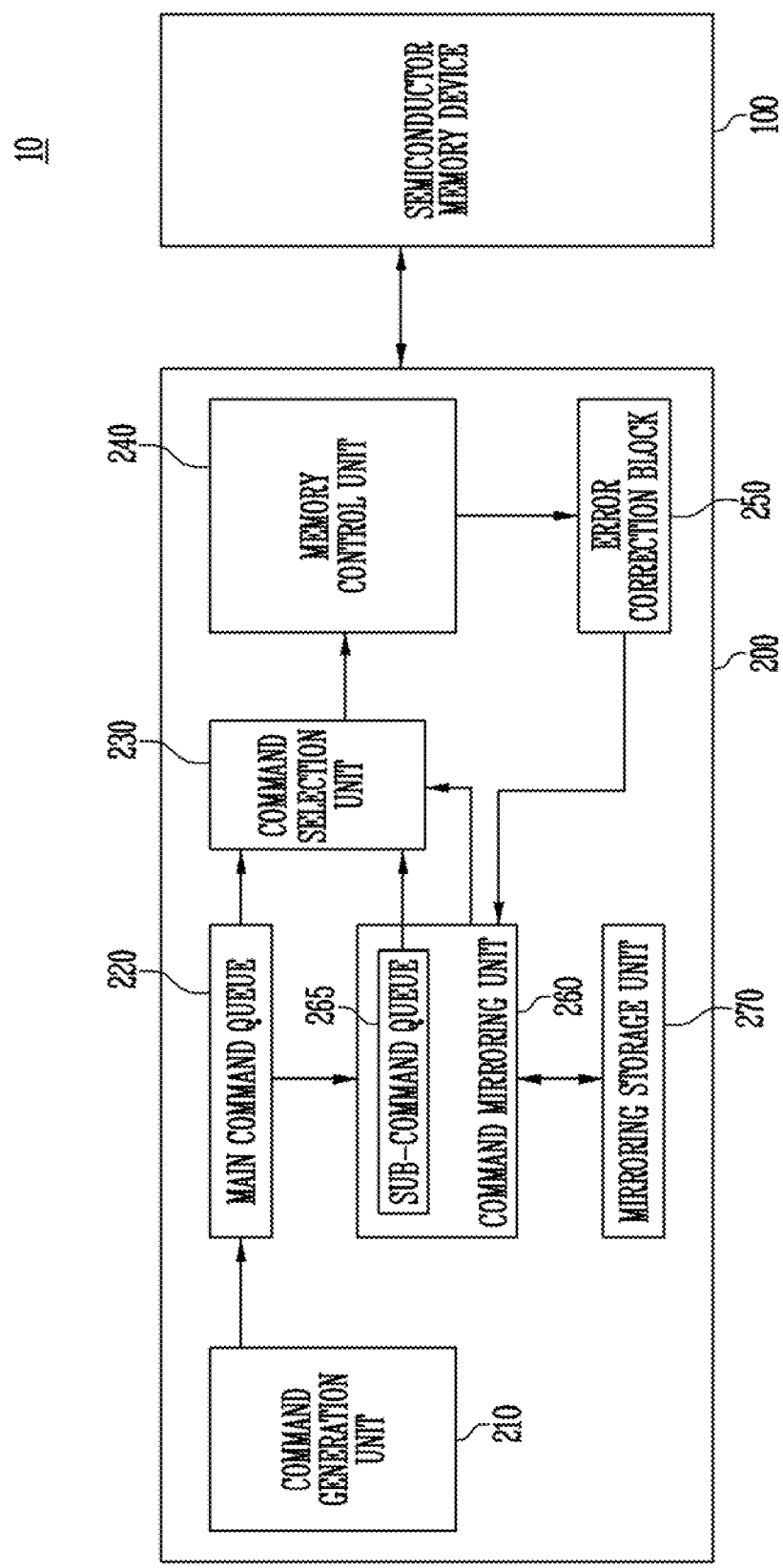
FIG. 1 is a block diagram illustrating a memory system according to an embodiment.
Figure 2:
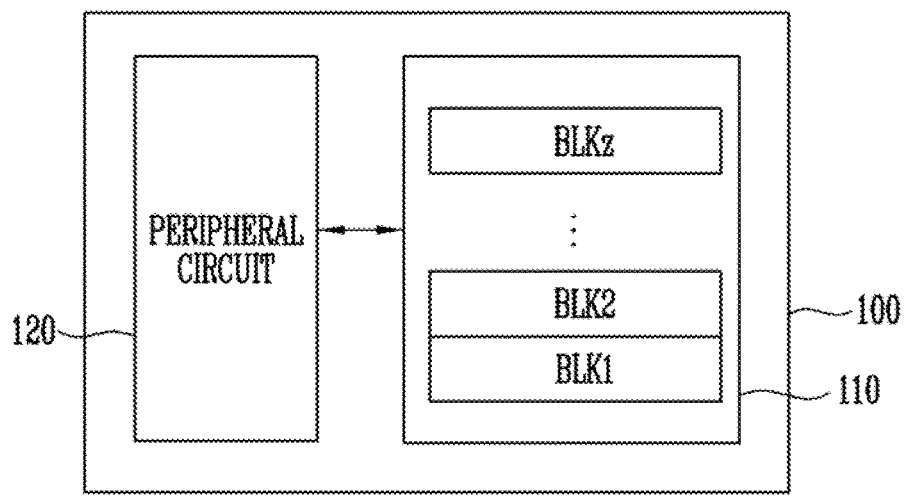
FIG. 2 is a block diagram further illustrating a semiconductor memory device for the memory system shown in FIG. 1.
Figure 3:
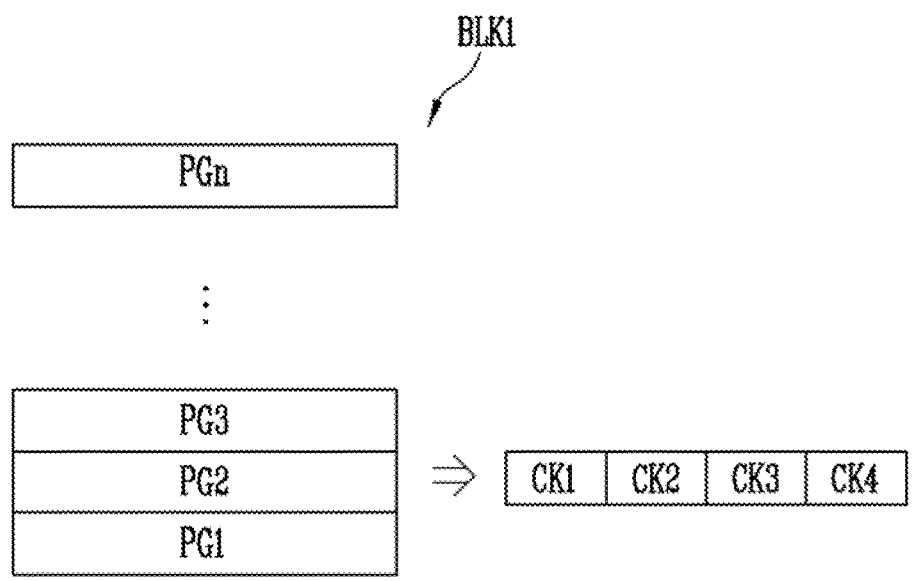
FIG. 3 is a block diagram illustrating one of the memory blocks of the semiconductor device shown in FIG. 2.

Furthermore, it should be noted that the terms 'connected' or 'coupled' as used in this disclosure are intended to mean that a component is 'directly electrically' coupled to another component or indirectly electrically coupled through another component. A singular form may include a plural form as long as it is not specifically mentioned in a sentence. Furthermore, 'include/comprise' or 'including/comprising' used in the specification represents that one or more components, steps, operations, and elements exists or have been added. FIG. 1 is a block diagram illustrating a memory system according to an embodiment. FIG. 2 is a block diagram further illustrating a semiconductor memory device for the memory system shown in FIG. 1. FIG. 3 is a block diagram illustrating one of the memory blocks of the semiconductor device shown in FIG. 2.

As shown in FIG. 1, a memory system 10 is provided, the memory system comprising a semiconductor memory device 100 and a controller 200 for controlling the operation of the semiconductor device. The semiconductor memory device 100 may operate under the control of the controller 200. The semiconductor memory device 100 may program data, read internally stored data and/or erase the internally stored data under the control of the controller 200. Other functions may also be performed by the semiconductor device under the control of the controller 200 without departing form the scope of the invention.

As shown in FIG. 2, the semiconductor memory device 100 may include a memory cell array 110 and a peripheral circuit 120 for driving the memory cell array 110. The memory cell array 110 may include a plurality of memory blocks BLK1 to BLKz. As shown in FIG. 3, at least one of the memory blocks, for example memory block BLK1 may include a plorality of pages PG1 to PGn. A single page may include one or more memory cells (not illustrated). A program operation and a read operation of the semiconductor memory device 100 may be performed in units of pages. An erase operation of the semiconductor memory device 100 may be performed in units of memory blocks.

Each of the pages may include a plurality of chunks. According to the example shown in FIG. 3 each page may include four chunks CK1 to CK4. However, the number of chunks per page may vary.

Referring again to FIG. 2, the peripheral circuit 120 may operate under the control of the controller 200.

For example, during a program operation, the peripheral circuit 120 may receive a program command, a physical block address and data from the controller 200. A single memory block and a single page included therein may be selected by the physical block address. The peripheral circuit 120 may program a selected page with data.

During a read operation, the peripheral circuit 120 may receive a read command and a physical block address from the controller 200. A single memory block and a single page included therein may be selected by the physical block address. The peripheral circuit 120 may read data from the selected page and output the read data to the controller 200.

During an erase operation, the peripheral circuit 120 may receive an erase command and a physical block address from the controller 200 A single memory block may be selected by the physical block address. The peripheral circuit 120 may erase data from the memory block corresponding to the physical block address.

During a read operation data may be read from the first to fourth chunks CK1 to CK4 of the selected page as shown in FIG. 3. The data read from the chunks CK1 to CK4 may be code words. The code words may be output to the controller 200. Each of the code words may be a unit of error correction code (ECC) operation performed by the controller 200.

The semiconductor memory device 100 may be a non-volatile memory device. For example, the semiconductor memory device 100 may be a flash memory device.

The controller 200 may control the semiconductor memory device 100. The controller 200 may access the semiconductor memory device 100 in response to a request from a host (not illustrated). For example, the controller 200 may control a read operation, a program operation, an erase operation, and/or a background operation of the semiconductor memory device 100. The controller 200 may provide an interface between the semiconductor memory device 100 and the host. The controller 200 may drive firmware for controlling the semiconductor memory device 100.

The controller 200 may include a command generation unit 210, a command queue 220, a command selection unit 230, a memory control unit 240, an error correction block 250, a command mirroring unit 260, and a mirroring storage unit 270.

The command generation unit 210 may control the general operation of the controller 200. The command generation unit 210 may generate a command and input the generated command to the main command queue 220.

According to an embodiment, when receiving a request from the host, the command generation unit 210 may generate a command corresponding to the request and input the generated command to the main command queue 220.

According to an embodiment, the command generation unit 210 may generate a command without any request from the host, and input the generated command to the main command queue 220. For example, the command generation unit 210 may generate a command for the background operations such as wear leveling operations and garbage collection operations of the semiconductor memory device 100.

According to an embodiment, the command generation unit 210 may function as a flash translation layer. The command generation unit 210 may translate a logical block address included in the request into a physical block address. The command generation unit 210 may store the physical block address associated with the corresponding command in a RAM (not illustrated) of the controller 200.

The main command queue 220 may be coupled between the command generation unit 210 and the command selection unit 230. The main command queue 220 may operate on a first-in-first-out (FIFO) basis. The main command queue 220 may transfer a command from the command generation unit 210 to the command selection unit 230.

The command selection unit 230 ray be coupled to the main command queue 220, the command mirroring unit 260 and the memory control unit 240. The command selection unit 230 may select the main command queue 220 or the sub-command queue 265 under the control of the command mirroring unit 260. For example, when a control signal provided from the command mirroring unit 260 is disabled, the command selection unit 230 may output the command stored in the main command queue 220 to the memory control unit 240. When the control signal provided from the command mirroring unit 260 is enabled, the command selection unit 230 may output the command stored in the sub-command queue 265 to the memory control unit 240.

The memory control unit 40 may be coupled to the command selection unit 230 and the error correction block 250. The memory control unit 240 may communicate with the semiconductor memory device 100, and operate under the control of the command generation unit 210. The memory control unit 240 may command the semiconductor memory device 100 by transferring the command from the command selection unit 230 to the semiconductor memory device 100. The memory control unit 240 may transfer the command and the physical block address, which is stored in the RAM and associated with the command, to the semiconductor memory device 100.

In the disclosure, a read command for the selected page may represent the read command, and the physical block address indicating the selected page, a program command for the selected page may represent the program command, the physical block address indicating the selected page, and data to be programmed; and an erase command for the selected memory block may represent the erase command and the physical block address indicating the selected memory block.

In response to the read command for the selected page of the semiconductor memory device 100, data or code words stored in a portion or entirety of chunks of the selected page may be provided from the semiconductor memory device 100. According to the corresponding physical block address of the read command, the chunks of the selected page are read in part or in whole. The chunks may be selected by a column address included n the physical block address. For convenience of explanation, it is assumed that the first to fourth code words respectively stored in the first to fourth chunks CK1 to CK4 of the selected page may be provided.

The memory control unit 240 may transfer the first to fourth code words to the error correction block 250. The error correction block 250 may perform an error correction operation to each of the first to fourth code words. The error correction block 250 may perform the error correction operation according to an error correction code (ECC). According to an embodiment, the error correction block 250 may perform the error correction operation according to a hard-decision error correction code When the error correction operation to each of the first to fourth code words is successful, the error correction block 250 may provide first to fourth error-corrected code words. According to an embodiment, the error correction block 250 may store the first to fourth error-corrected code words in the RAM (not illustrated) of the controller 200, and the command generation unit 210 may output the first to fourth error-corrected code words from the RAM to the host, The command mirroring unit 260 may be coupled to the main command queue 220 and the mirroring storage unit 270. According to an embodiment, the command mirroring unit 260 may generate a mirrored command by mirroring the read command input to the main command queue 220 and store the generated mirrored command in the mirroring storage unit 270. Therefore, even when the first read command is dequeued and does not remain in the main command queue 220, the mirrored command may be provided if necessary.

According to an embodiment, when the error correction operation to each of the corresponding code words is successful, the command mirroring unit 260 may cancel the mirrored command stored in the mirroring storage unit 270.

The command mirroring unit 260 may refer to the mirrored command stored in the mirroring storage unit 270 when the error correction operation to at least one of the first to fourth code words fails. The command mirroring unit 260 may generate a second read command on the basis of the mirrored command and input the second read command in the sub-command queue 265. According to an embodiment, the command mirroring unit 260 may receive an alarm signal indicating that the error correction operation fails from the error correction block 250. The command mirroring unit 260 may transmit a request for the mirrored command stored in the mirroring storage unit 270 in response to the alarm signal.

According to an embodiment, the command mirroring unit 260 may generate the second read command which is the same as the mirrored command. The command mirroring unit 260 may input the second read command to the sub-command queue 265 and store the physical block address indicating the selected page in association with the second read command in the RAM. In other words, the command mirroring unit 260 may generate the second read command for the selected page based on the mirrored command. The column address included in the physical block address may indicate the first to fourth chunks CK1 to CK4.

According to an embodiment, the command mirroring unit 260 may receive code word information about the code word, to which the error correction operation fails, from the error correction block 250. The error correction block 250 may store the code words, to which the error correction operation is successful, in the RAM. The command mirroring unit 260 may generate the second read command for the chunk of the code word, to which the error correction operation fails, based on the mirrored command and the code word information. The command mirroring unit 260 may input the second read command to the sub-command queue 265 and store the physical block address indicating the chunk of the code word, to which the error correction operation fails, in the RAM in association with the second read command. A row address included in the physical block address may indicate the selected page, and a column address included in the physical block address may indicate the chunk of the code word, to which the error correction operation fails.

In addition, the command mirroring unit 260 may control the command selection unit 230 to select the sub-command queue 265 by enabling the control signal transferred to the command selection unit 230.

The command selection unit 230 may dequeue the second read command stored in the sub-command queue 265 and provide the dequeued read command to the memory control unit 240. The memory control unit 240 may transfer the second read command and the physical block address, which stored in the RAM in association with the second read command, to the semiconductor memory device 100.

According to an embodiment, in response to the second read command for the selected page, the code words of the first to fourth chunks CK1 to CK4 may be provided from the semiconductor memory device 100. The memory control unit 240 may transfer the received code words to the error correction block 250, and the error correction block 250 may perform error correction operation to each of the code words. When the error correction operation to each of the code words passes, the error correction block 250 may provide the error-corrected code word s. The command generation unit 210 may output the error-corrected code words to the host. When the error correction operation to at least one of the code words fails, the command generation unit 210 may output a read fail signal to he host.

According to an embodiment, in response to the second read command for the chunk of the code word, to which the error correction operation fails, the code word of the corresponding chunk may be provided from the semiconductor memory device 100. The memory control unit 240 may transfer the received code word to the error correction block 250, and the error correction block 250 may perform error correction operation to the code word. When the error correction operation to the corresponding code word passes, the error correction block 250 may provide the corresponding error-corrected code word.

The error-corrected code word according to the second read command and the error-corrected code words, which stored in the RAM according to the first read command, may correspond to the data stored in the selected page. The command generation unit 210 may output the error-corrected code word according to the first and second read commands to the host. When the error correction operation to the code word fails despite of the second read command, the error correction block 250 may output a read fail signal to the host. According this embodiment, since a smaller number of code words are transferred from the semiconductor memory device 100 to the controller 200 the time taken to transfer the code words from the semiconductor memory device 100 to the controller 200 may be reduced. In addition, since the error correction operation of a smaller number of code words is performed, the time taken for the error correction block 250 to perform the error correction may be reduced.

According to an embodiment, the mirrored command may be provided. When the error correction operation to each of the code words fails in response to the first read command generated by the command generation unit 210, the main command queue 220 may not be requested to cancel commands which are subsequently generated by the command generation unit 210. The command mirroring unit 260 may generate the second read command on the basis of the mirrored command. In addition, a code word corresponding to the second read command may be acquired. While only the commands remaining in the main command queue 220 are interrupted from being dequeued, of the read operation to the selected page may be performed on the basis of the mirrored command.

On the assumption that the mirroring command is not provided, the command generation unit 210 may generate a first read command and subsequently continue enqueuing various types of commands to the main command queue 220. When error correction of each of the code words corresponding to the first read command fails, the remaining commands in the main command queue 220 may be canceled aborted. When the commands enqueued to the main command queue 220 are not aborted and are processed in a first-in first-out basis without providing a response corresponding to the first read command to the host, an operating speed of the host may be reduced. When the error correction of the code words corresponding to the first read command fails the command generation unit 210 may cancel or abort the commands enqueued to the main command queue 220 and enqueue a command to identify data of the selected page (e.g., second read command) to the main command queue 220. However, these operations may reduce the operating speed of the controller 200.

According to an embodiment, the first read command may be mirrored before the semiconductor memory device 100 operates in response to the first read command. When the error correction operation in response to the first read command fails, the second read command may be generated on the basis of the mirrored command. Therefore, the data stored in the selected page may be read again in response to the second read command while keeping the enqueued commands in the main command queue 220 without cancellation. Therefore, the controller 200 and the memory system 10 having an improved operating speed may be provided.

Figure 4:
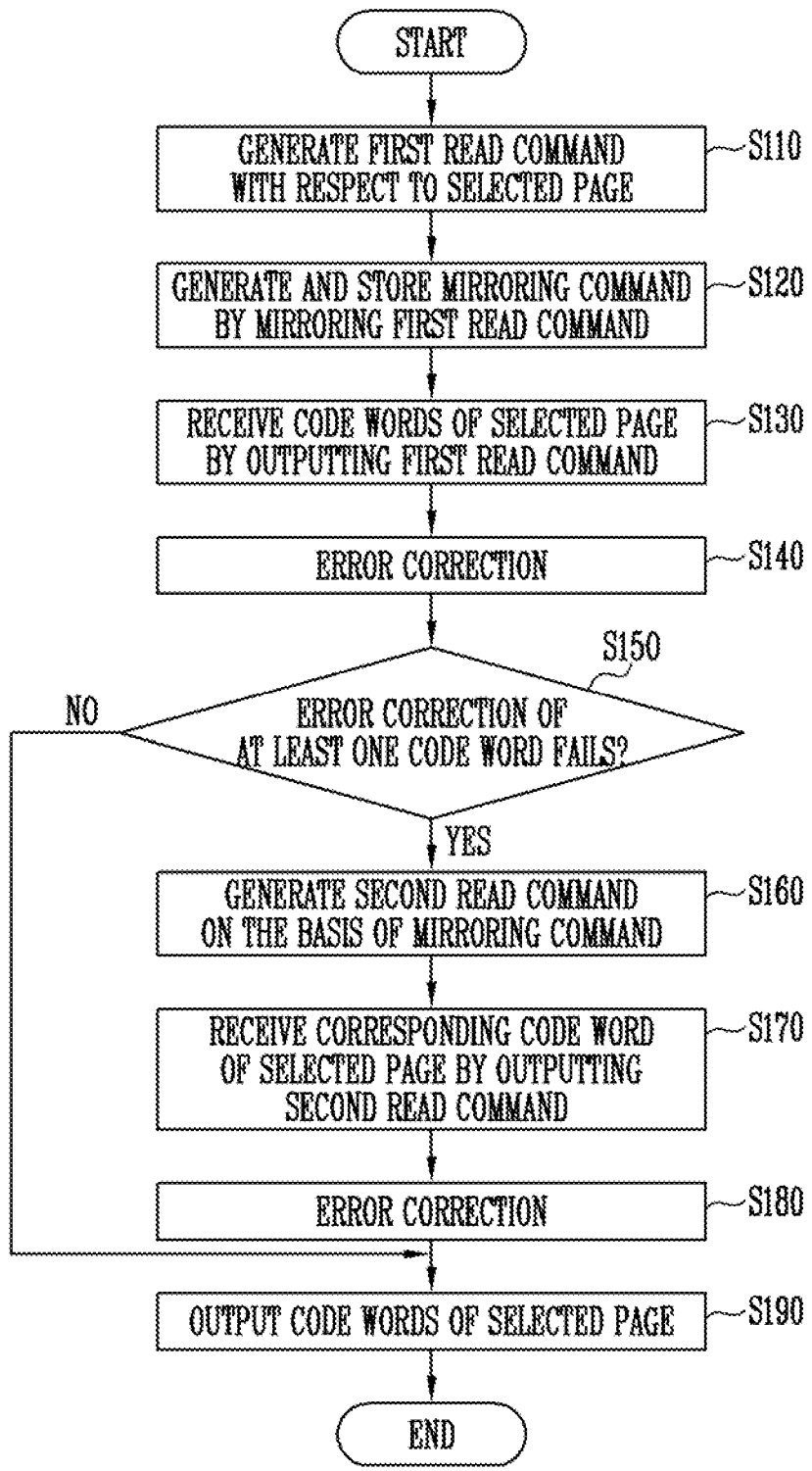
FIG. 4 is a flowchart illustrating an operating method of a controller for a semiconductor memory device according to an embodiment.

FIG. 4 is a flowchart illustrating an operating method of the controller 200 according to an embodiment.

Referring to FIGS. 1 to 4, at step S110, a first read command for a selected page may be generated. The first read command may be enqueued to the main command queue 220.

At step S120, a mirrored command may be generated by mirroring the first read command. The mirrored command may be stored in the mirroring storage unit 270.

At step S130, the read operation may be performed in response to the first read command and the code words of the selected page may be provided from the semiconductor memory device 100. The first read command stored in the main command queue 220 may be dequeued by the command selection unit 230 and provided to the semiconductor memory device 100 through the memory control unit 240. The semiconductor memory device 100 may provide the code words stored in the chunks of the selected page in response to the first read command.

At step S140, the error correction operation may be performed to each of the received code words.

According to an embodiment, various error correction codes may be used. Examples of the error correction codes may include the Bose-Chaudhri-Hocquenghem (BCH) code, the Reed Solomon code, the Hamming code, and the low density parity check (LDPC) code.

At step S150, it may be determined whether error correction operation to at least one code word fails. When the error correction operation to each of the code words passes, the code words of the selected page (i.e., error-corrected code words) may be output to the host at S190.

At step S160, when the error correction operation to at least one code word fails, a second read command may be generated on the basis of the mirrored command. The commands stored in the main command queue 220 may be interrupted from being dequeued. The commands stored in the main command queue 220 may be dequeued after the error correction based on the mirrored command is completed.

According to an embodiment, the second read command may be a read command for the selected page.

According to another embodiment, the second read command may be a read command for a chunk of the code word to which the error correction operation fails. The code ward or code words, to which the error correction in response to the first read command passes, may be internally stored in the controller 200. According to this embodiment, the time taken to transfer a code word from the semiconductor memory device 100 to the controller 200 may be reduced. In addition, the time taken to retry of the read operation to the selected page may be reduced because the retry o the read operation is performed in response to the second read command only to the code words, to which the error correction operation in response to the first read command fails.

The second read command may be enqueued to the sub-command queue 265.

At step S170, the read operation may be performed in response to the second read command for the corresponding code word of the selected page, to which the error correction operation in response to the first read command fails, and the corresponding code words of the selected page may be provided from the semiconductor memory device 100. The command selection unit 230 may dequeue the second read command from the sub-command queue 265. The second read command may be dequeued by the command selection unit 230 and provided to the semiconductor memory device 100 through the memory control unit 240. The semiconductor memory device 100 may provide the corresponding code word of the selected page in response to the second read command.

According to an embodiment, when the second read command is a read command for the selected page, code words may be read from the first to fourth chunks CK1 to CK4 shown in FIG. 3 of the selected page. According to another embodiment, when the second read command is a read command for the code word, to which the error correction operation in response to the first read command fails, the corresponding code word may be read from a selected chunk of the selected page.

At step S180, the error correction operation may be performed to each of the corresponding code words. In addition, at step S190, the corresponding code words of the selected page may be output to the host. Although not illustrated, when the error correction operation to at least one of the corresponding code words fails despite of the second read command, the command generation unit 210 may output a read fail signal to the host.

According to an embodiment, the first read command may be mirrored before the semiconductor memory device 100 operates in response to the first read command. When the error correction operation in response to the first read command fails, the second read command may be generated on the basis of the mirrored command. Therefore, the data stored in the selected page may be read again in response to the second read command while keeping the enqueued commands in the main command queue 220 without cancellation. Therefore, the controller 200 and the memory system 10 having an improved operating speed may be provided.

Figure 5:
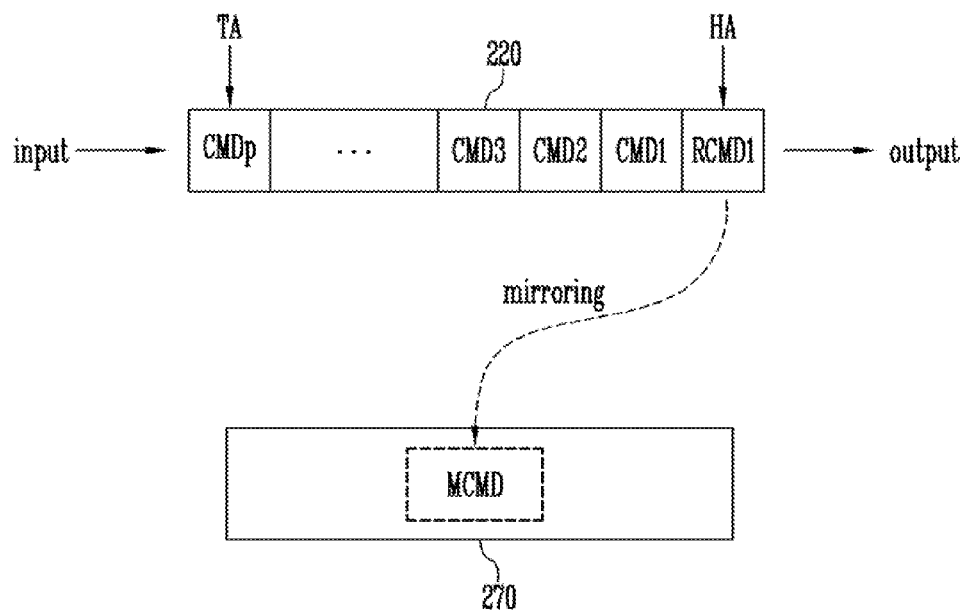
FIG. 5 is a simplified schematic showing commands stored in a main command queue and a mirroring storage unit according to an embodiment.

FIG. 5 is a view illustrating commands stored in the main command queue 220 and the mirroring storage unit 270 shown in FIG. 1.

Referring to FIG. 5, the main command queue 220 may store a plurality of commands RCMD1 and CMD1 to CMDp between a head address HA and a tail address TA. For example, the command generation unit 210 may generate a first read command RCMD1 followed by first to pth commands CMD1 to CMDp. The first to pth commands CMD1 to CMDp may be various types of commands. Each of the first to pth commands CMD1 to CMDp may be any of a program command, a read command and an erase command.

The head address HA may Indicate the first command RCMD1 of the main command queue 220. The tail address TA may indicate the last command CMDp of the main command queue 220. The main command queue 220 may operate on the FIFO basis. The plurality of commands RCMD1 and CMD1 to CMDp may be generated by the command generation unit 210, and the commands RCMD1 and CMD1 to CMDp may be stored in the main command queue 220 according to order in which the commands are input. When a new command is input to the main command queue 220, the tail address TA may refer to a new command. A command indicated by the head address HA of the main command queue 220 may be firstly output.

The read command stored in the main command queue 220 may be mirrored to the mirroring storage unit 270. In FIG. 5, the first read command RCMD1 may be stored in the head address HA of the main command queue 220. The first read command RCMD1 may be mirrored and stored as a mirrored command MCMD in the mirroring storage unit 270.

When a read command is present in the first to pth commands CMD1 to CMDp, the corresponding read command may be mirrored in the same manner as the first read command RCMD1.

Figure 6:
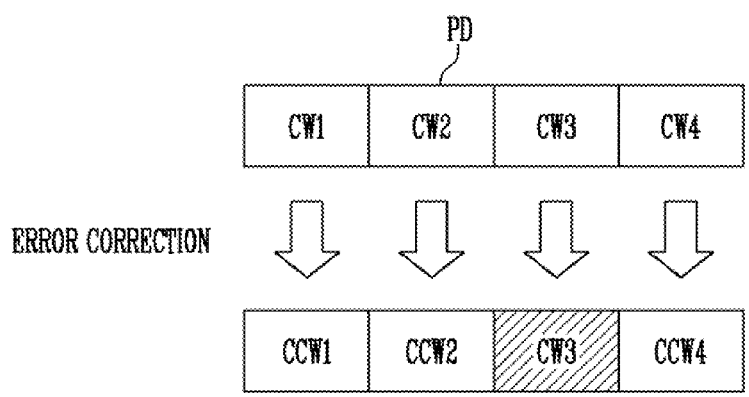
FIG. 6 is a simplified schematic illustrating error correction of page data read from a selected page.

FIG. 6 is a view illustrating the error correction operation to read page data PD.

Referring to FIGS. 1 and 6, when the page data PD corresponding to the first read command RCMD1 shown in FIG. 5 is read from the semiconductor memory device 100, the page data PD may include the first to fourth code words CW1 to CW4. The selected page may include the first to fourth chunks CK1 to CK4 shown in FIG. 3. The first to fourth code words CW1 to CW4 may be read from the first to fourth chunks CK1 to CK4 of the selected page, respectively.

The error correction block 250 may perform the error correction operation in units of code words. In other words, the error correction block 250 may perform on the error correction operation to each of the first to fourth code words CW1 to CW4. When the error correction operation is successful, the error-corrected code word may be generated. FIG. 6 illustrates first, second and fourth error-corrected code words CCW1, CCW2, and CCW4 as a result of the error correction operation to each of the first, second and fourth code words CW1, CW2, and CW4. On the contrary, FIG. 6 exemplarily illustrates the third code word CW3 with hatching lines, to which the error correction operation fails.

The error correction block 250 may store the first, second and fourth error-corrected code words CCW1, CCW2, and CCW4 in the RAM (not illustrated) of the controller 200. In addition, the error correction block 250 may provide information indicating the third code word CW3 to the command mirroring unit 260. Therefore, the command mirroring unit 260 may generate the second read command for the third chunk CK3 based on the mirrored command and code word information about the third code word CW3. The command mirroring unit 260 may enqueue the generated second read command to the sub-command queue 265.

Figure 7:
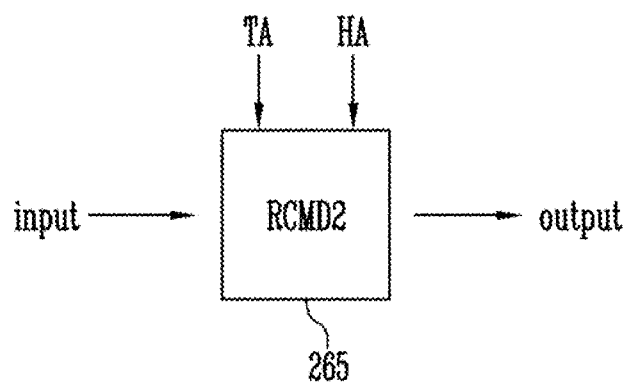
FIG. 7 is a simplified schematic view showing a command stored in a sub-command queue.

FIG. 7 is a view of a command (RCMD2) stored in the sub-command queue 265.

Referring to FIG. 7, the sub-command queue 265 may store the second read command RCMD2 between the head address HA and the tail address TA. When the sub-command queue 265 stores a single read command, the head address HA and the tail address TA may indicate the same command.

The command selection unit 230 may perform a dequeue operation from the sub-command queue 265 under the control of the command mirroring unit 260. The command selection unit 230 may transfer the second read command RCMD2 to the memory control unit 240. The memory control. unit 240 may acquire the corresponding code word, to which the error correction operation in response to the original read command RCMD1 fails, by providing the second read command RCMD2 to the semiconductor memory device 100.

Figure 8:
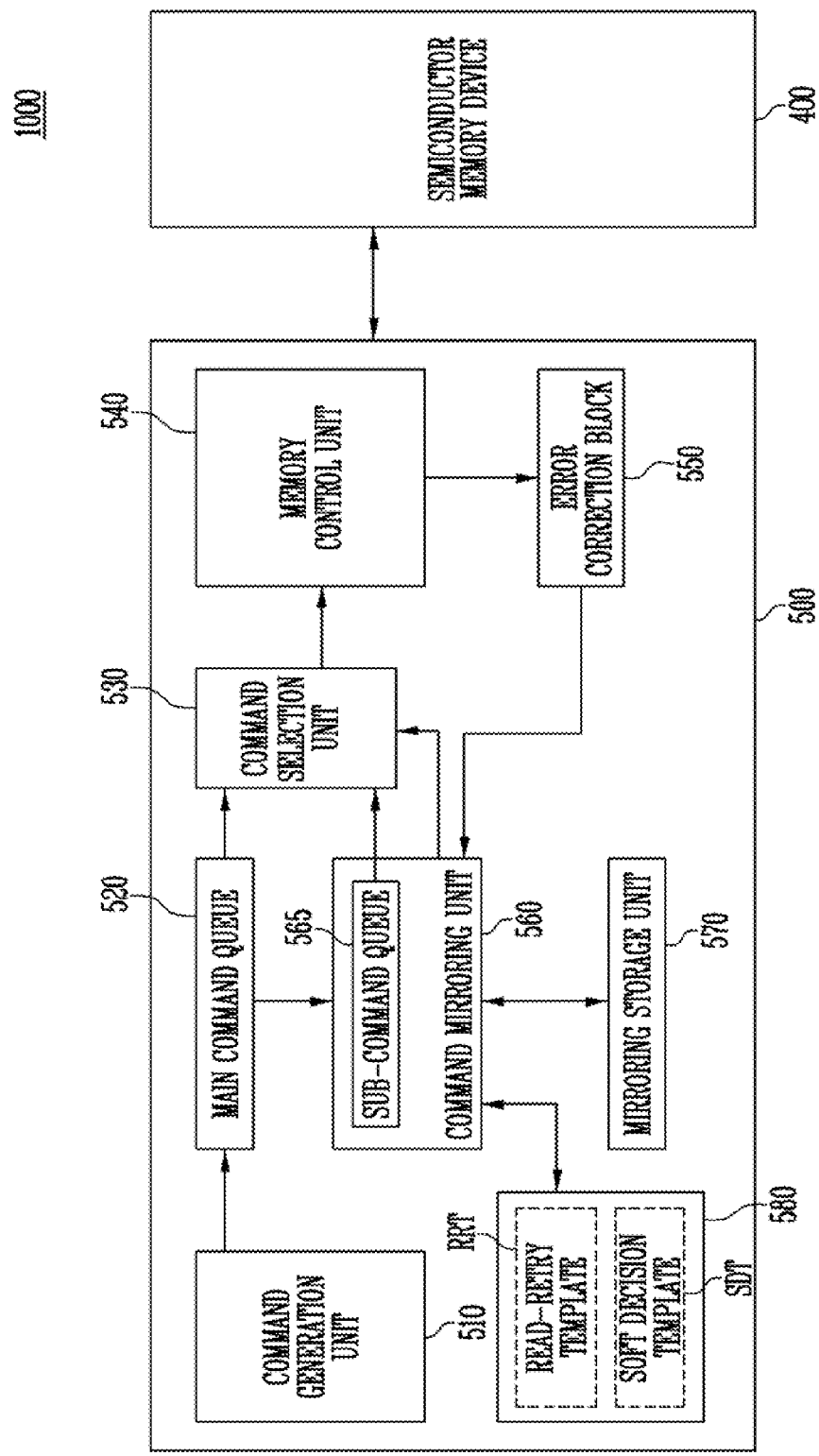
FIG. 8 is a block diagram illustrating a memory system according to another embodiment.

FIG. 8 is a block diagram illustrating a memory system 1000 according to another embodiment. The memory system 1000 may be similar to the memory system 10 described with reference to FIGS. 1 to 7 except for a template storage unit 580.

Referring to FIG. 8, the memory system 1000 may include a semiconductor memory device 400 and a controller 500.

The controller 500 may include a command generation unit 510, a main command queue 520, a command selection unit 530, a memory control unit 540, an error correction block 550, a command mirroring unit 560, a mirroring storage unit 570, and the template storage unit 580.

The error correction block 550 may perform the error correction operation to each of the first to fourth code words in response to the first read command for the selected page.

According to an embodiment, when the error correction operation to at least one of the first to fourth code words fails, the command mirroring unit 560 may generate a plurality of sub-commands on the basis of the mirrored command and store the plurality of sub-commands to the sub-command queue 365. The plurality of sub-commands may correspond to the second read command described with reference to FIGS. 1 to 7.

According to an embodiment, the command mirroring unit 560 may generate the plurality of sub-commands for the read-retry operation to the selected page on the basis of the mirrored command and a read-retry template (RRT). The selected page may be specified by the mirrored command. The read-retry template RRT may include information about a series of commands for the read-retry operation.

According to an embodiment, the command mirroring unit 560 may receive code word information indicating a code word, to which the error correction operation in response to the first read command fails, from the error correction block 550. The command mirroring unit 560 may generate the plurality of sub-commands for the read-retry operation to a chunk of the code word, to which the error correction operation in response to the first read command fails, by additionally referring to the code word information.

According to an embodiment, the command mirroring unit 560 may generate a plurality of sub-commands for the soft decision operation to the selected page on the basis of the mirrored command and a soft decision template (SDT). The soft decision template SDT may include information about a series of commands for the soft decision operation. In this embodiment, the error correction block 550 may perform a soft-decision-based error correction operation.

According to an embodiment, the command mirroring unit 560 may receive code word information indicating the code word, to which the error correction operation in response to the first read command fails, from the error correction block 550. The command mirroring unit 560 may generate the plurality of sub-commands for the soft decision operation to a chunk of the code word, to which the error correction operation in response to the first read command fails, by additionally referring to the code word information.

Figure 9:
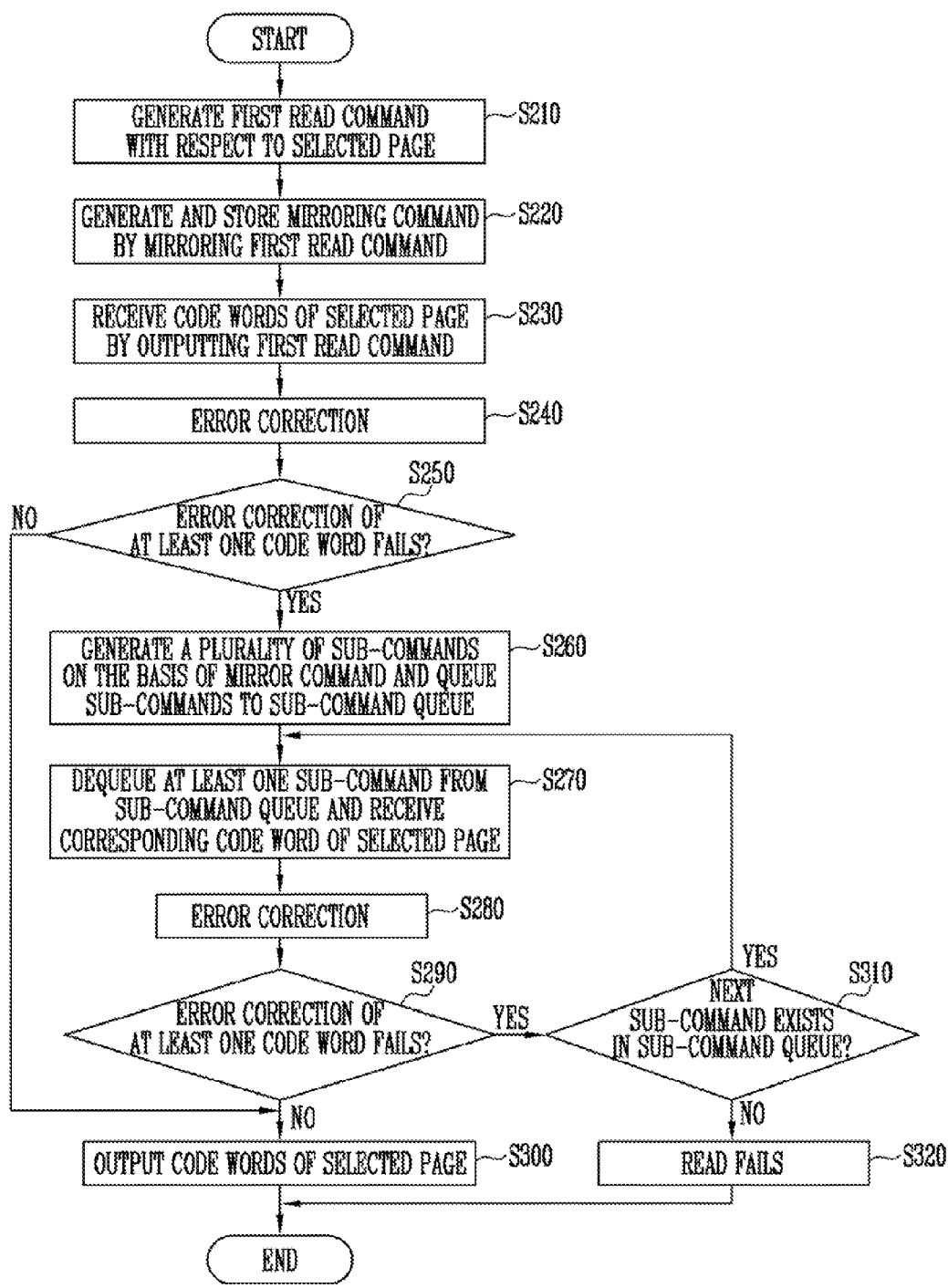
FIG. 9 is a flowchart illustrating an operating method of a controller according to an embodiment.

FIG. 9 is a flowchart illustrating an operating method of the controller 500 according to another embodiment.

Referring to FIGS. 8 and 9, steps S210 to 250 and S300 may be performed in similar way to steps S110 to S150 and S190 described with reference to FIG. 4.

At step S260 when the error correction operation to at least one code word fails, a plurality of sub-commands may be generated on the basis of the mirrored command. The generated sub-commands may be enqueued to the sub-command queue 565. The commands stored in the main command queue 520 may be interrupted from being dequeued. The commands stored in the main command queue 520 may be dequeued after the error correction based on the mirrored command is completed.

According, to en embodiment, the command mirroring unit 560 may generate the sub-commands including a parameter setting command and a read command for the selected page on the basis of the mirrored command and the read-retry template RRT. The parameter setting command may include information about a read voltage to be applied to a word line of the selected page during the read operation.

When the parameter setting command is provided to the semiconductor memory device 400, the peripheral circuit 120 in the semiconductor memory device 400 may reset the read voltage according to the parameter setting command. When the parameter setting command and the read command for the selected page are sequentially provided to the semiconductor memory device 400, the read voltage may be reset, and data of the selected page may be read according to the reset read voltage. The error correction block 550 may perform the error correction operation through, for example, the hard decision operation to the read data at step S280.

In another example, the command mirroring unit 560 may generate the sub-commands including a plurality of parameter setting commands and read commands for the selected page on the basis of the mirrored command and the read-retry template RRT. When the parameter setting commands and the read commands for the selected page are provided to the semiconductor memory device 400, resetting the read voltage and reading data from the selected page according to the reset read voltage may be repeated. Whenever data is read, the error correction block 550 may perform the error correction operation through, for example, the hard decision operation on the read data. When the error correction passes, the sub-commands remaining in the sub-command queue 565 may be canceled.

According to an embodiment, the command mirroring unit 560 may additionally refer to the code word information provided from the error correction block 550. The command mirroring unit 560 may generate the sub-commands including the parameter setting commands and the read commands for a chunk of a code word, to which the error correction operation in response to the first read command fails. A physical block address associated with the read command may indicate the chunk of the code word, to which the error correction operation in response to the first read command fails. Since the read command for the chunk of the code word, to which the error correction operation in response to the first read command fails, is provided instead of the read command for the selected page, the time taken to transfer the code word from the semiconductor memory device 400 to the controller 500 may be reduced. In addition, the time taken to retry of the read operation to the selected page may be reduced because the retry of the read operation is performed in response to the sub-commands only to the code words, to which the error correction operation in response to the first read command fails.

In another example, the command mirroring unit 560 may generate the sub-commands including a plurality of parameter setting commands and a plurality of read commands for a chunk of a code word, to which the error correction operation in response to the first read command fails, on the basis of the mirrored command and the soft decision template SDT. Plural operations of resetting the read voltage and reading data of the selected page according to the reset read voltage may be performed in response to the parameter setting, commands and the read commands for the selected page provided to the semiconductor memory device 400. The error correction block 550 may perform the soft-decision-based error-correction operation to the data of the selected page at step S280.

According to an embodiment, the command mirroring unit 560 may additionally refer to the code word information provided from the error correction block 550 in addition to the mirrored command and the soft decision template SDT. The command mirroring unit 560 may generate the sub-commands including the plurality of parameter setting commands and the plurality of read commands for a chunk of a code word, to which the error correction operation in response to the first read command fails. A physical block address corresponding to each of the read commands may refer to the chunk of the code word, to which the error correction operation in response to the first read command fails. Since the read command for the chunk of the code word, to which the error correction operation in response to the first read command fails, is provided instead of the read command for the selected page, communication time between the semiconductor memory device 400 and the controller 500 may be reduced. In addition, the time taken to retry of the read operation to the selected page may be reduced because the retry of the read operation is performed in response to the sub-commands only to the code words, to which the error correction operation in response to the first read command fails.

In addition to the above, the command mirroring unit 560 may generate sub-commands by various methods on the basis of the mirrored command.

Steps S270 to S320 may be repeated in response to the one or more sub-commands of the sub-command queue 565 including one or more parameter setting commands and read commands for the read-retry operations or the soft-decision-based error correction operations with one or more read voltages.

At step S270, the read operation may be performed in response to at least one sub-command of the sub-command queue 565 for the corresponding code word, to which the error correction operation in response to the first read command fails and the corresponding code words of the selected page may be provided from the semiconductor memory device 400. The command selection unit 530 may dequeue the sub-command from the sub-command queue 565. The sub-command may be dequeued by the command selection unit 530 and provided to the semiconductor memory device 400 through the memory control unit 540. The semiconductor memory device 400 may provide the corresponding code word of the selected page in response to the provided sub-command when the provided sub-command is a read command.

At step S280, error correction may be performed on the corresponding code word in response to the sub-commands of the sub-command queue 565 including one or more parameter setting commands and read commands for the read-retry operations or the soft-decision-based error correction operations with one or more read voltages.

At step S290, it may be determined whether of the error correction operation of step S280 to at least one code word fails.

When the error correction operation of step S280 to each of the code words passes, the corresponding code word of the selected page (i.e., error-corrected code words) may be output to the host at S300.

At step S310, it may be determined whether the sub-commands remain in the sub-command queue 565. If so, step S270 may be performed again. If not, step S320 may be performed.

At step S320, a read fail signal may be output to the host.

According to another embodiment, steps S270 to S320 may be repeated in response to the sub-commands of the sub-command queue 565 including the parameter setting, commands and read commands for the read retry operations with one or more read voltages and then the soft-decision-based error correction operations with one or more read voltages following the read retry operations.

Figure 10:
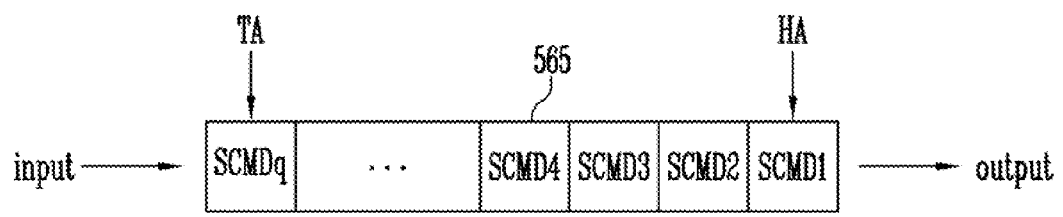
FIG. 10 is a simplified schematic illustrating sub-commands stored in a sub-command queue.

FIG. 10 is a view of the sub-commands SCMD1 to SCMDq stored in the sub-command queue 565.

Referring to FIG. 10, the plurality of sub-commands SCMD1 to SCMDq generated on the basis of the mirrored command may be stored between the head address HA and the tail address TA of the sub-command queue 565. According to an embodiment, the plurality of sub-commands SCMD1 to SCMDq may be commands for the read-retry operation. According to another embodiment the plurality of sub-commands SCMD1 to SCMDq may be commands for the soft decision operation.

The head address HA may indicate the first sub-command SCMD1 of the sub-command queue 565. The tail address TA may indicate the last sub-command SCMDq of the sub-command queue 565. The sub-command queue 565 may operate on the FIFO basis. During a dequeue operation, the sub-command SCMD1 indicated by the head address HA may be dequeued. During an enqueue operation, the sub-command SCMDq may be enqueued to the tail address TA.

The command selection unit 530 may perform a dequeue operation to the sub-command queue 565 under the control of the command mirroring unit 560. The command selection unit 230 may dequeue and transfer the sub-command SCMD1 indicated by the head address HA to the memory control unit 540. The memory control unit 540 may provide the dequeued sub-command SCMD1 to the semiconductor memory device 400.

According to an embodiment, the first read command may be mirrored before the semiconductor memory device 100 operates in response to the first read command. When the error correction operation in response to the first read command fails, the plurality of sub-commands may be generated on the basis of the mirrored command. Therefore, the data stored in the selected page may be read again in response to the plurality of sub-commands while keeping the enqueued commands in the main command queue 220 without cancellation. Therefore, the controller 500 and the memory system 1000 having an improved operating speed may be provided.

Figure 11:
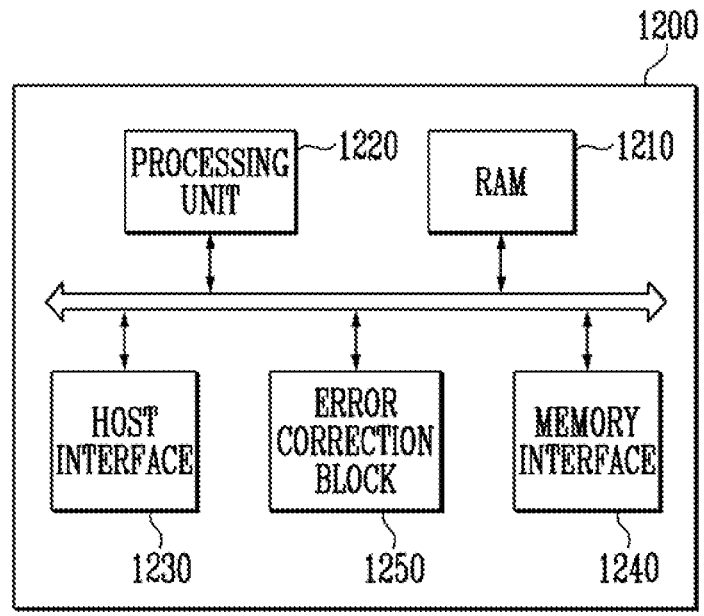
FIG. 11 is a block diagram illustrating a controller according to an embodiment 8.

FIG. 11 is a block diagram illustrating one embodiment (1200) of the controller 200 or 500 shown in FIG. 1 or 8.

Referring to FIG. 11, the controller 1200 may include a Random Access Memory (RAM) 1210, a processing unit 1220, a host interface 1230, a memory interface 1240, a memory interface and an error correction block 1250.

The processing unit 1220 may control the general operation of the controller 1200. The RAM 1210 may be used as at least one of an operation memory of the processing unit 1220, a cache memory between the semiconductor memory device 100 or 400 as shown in FIG. 1 or 8 and the host, and a buffer memory between the semiconductor memory device 100 or 400 and the host. The processing unit 1220 and the RAM 1210 may function as the command generation units 210 and 510 and the command mirroring units 260 and 560 as shown in FIGS. 1 and 8. For example, the processing unit 1220 may load a program command, a data file and a data structure to the RAM 1210 and execute the loaded data to function as the command generation units 210 and 510 and the command mirroring units 260 and 560. In another example, the processing unit 1220 and the RAM 1210 may function as the command generation units 210 and 510 shown in FIGS. 1 and 8. In addition, the command mirroring units 260 and 560 may be provided as separate hardware modules.

According to an embodiment, the main command queues 220 and 520, the sub-command queues 265 and 565, the mirroring storage units 270 and 570, and the template storage unit 580 may be provided as components included in the RAM 1210.

The host interface 1230 may include a protocol for data exchange between the host and the controller 1200. According to an embodiment, the controller 1200 may be suitable for performing interfacing with the host. For example, the controller 1200 may communicate with the host through at least one of various protocols such as USB (Universal Serial Bus) protocol, MMC (MultiMedia Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, IDE (Integrated Drive Electronics) protocol and private protocol.

The memory interface 1240 may perform interfacing with the semiconductor memory devices 100 and 400. The memory interface 1240 may function as the command selection unit 530 and the memory control unit 540.

The error correction block 1250 may decode data received from the semiconductor memory device 100 or 400 by using an error correction code. The error correction block 1250 may function as the error correction blocks 250 and 550 shown in FIGS. 1 and 8.

Figure 12:
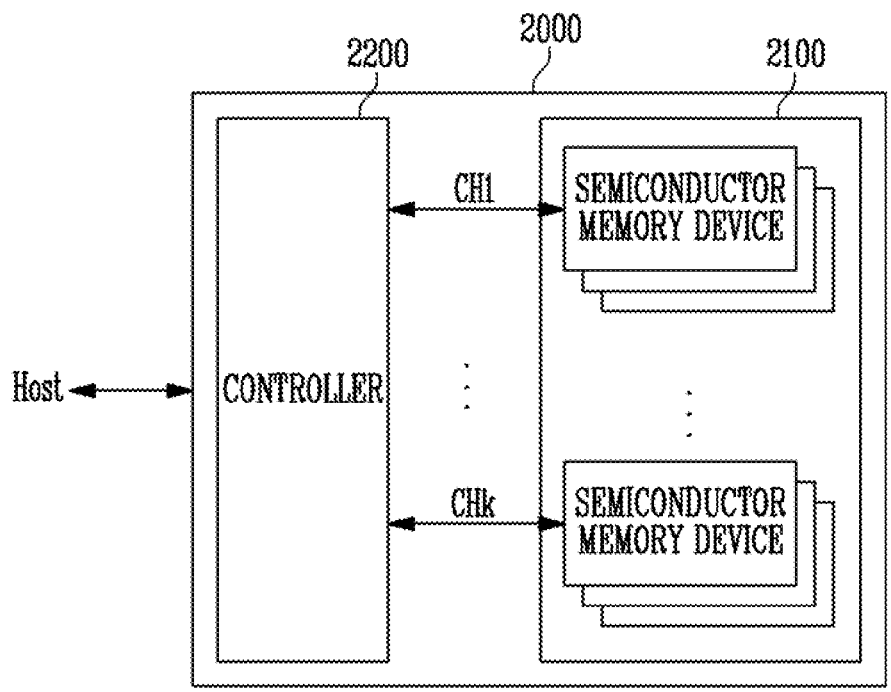
FIG. 12 is a block diagram illustrating an application example of a memory system, according to an embodiment.

FIG. 12 is a block diagram illustrating an application example (2000) of the memory system 1000 shown in FIG. 1.

Referring to FIG. 12, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

FIG. 12 illustrates that the plurality of groups communicate with the controller 2200 through first to kth channels CH1 to CHk, respectively. Each of the semiconductor memory chips may be configured and operated in substantially the same manner as the semiconductor memory device 100 described above with reference to FIGS. 1 and 2.

Each group may be configured to communicate with the controller 2200 through a single common channel. The controller 2200 may be configured in substantially the same manner as the controller 200 described above with reference to FIG. 1, and may control the plurality of memory chips of the semiconductor memory device 2100 through the plurality of channels CH1 to CHk. In another example, the main command queue 220, the command selection unit 230, the memory control unit 240, the error correction block 250, the command mirroring unit 260 and the mirroring storage unit 270 may form a single control group. The controller 2200 may include a plurality of control groups corresponding to the plurality of channels CH1 to CHk, respectively. The command generation unit 210 may interleave generated commands and enqueue the interleaved commands to the main command queue 220 of each control group.

FIG. 12 illustrates a plurality of semiconductor memory chips coupled to a single channel. However, the memory system 2000 may be modified so that a single memory chip may be coupled to a single channel.

The controller 2200 and the semiconductor memory device 2100 may be integrated into a single semiconductor device. According to an embodiment the controller 2200 and the semiconductor memory device 2100 may be integrated into a single semiconductor device to form a memory card. For example, the controller 2200 and the semiconductor memory device 2100 may be integrated into a single semiconductor device to form a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or universal flash storage (UFS).

The controller 2200 and the semiconductor memory device 2100 may be integrated into a single semiconductor device to form a solid state drive (SSD). When the memory system 1000 is used as a semiconductor drive (SSD), an operating speed of the host coupled to the memory system 2000 may be significantly increased.

In another example, the memory system 2000 may be a computer, a UMPC (Ultra Mobile PC), a workstation, a net-book, a PDA (Personal Digital Assistant), a portable computer, a web tablet, a wireless phone, a mobile phone, a smart phone, an e-book, a PMP (Portable Multimedia Player), a portable game console, a navigation device, a black box, a digital camera, a 3-dimensional television, a digital audio recorder a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network and an RFID device.

According to an embodiment, the semiconductor memory device 2100 or the memory system 2000 may be mounted using various types of packages. For example, the semiconductor memory device 2100 or the memory system 2000 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), wafer-level processed stack package (WSP), and the like.

Figure 13:
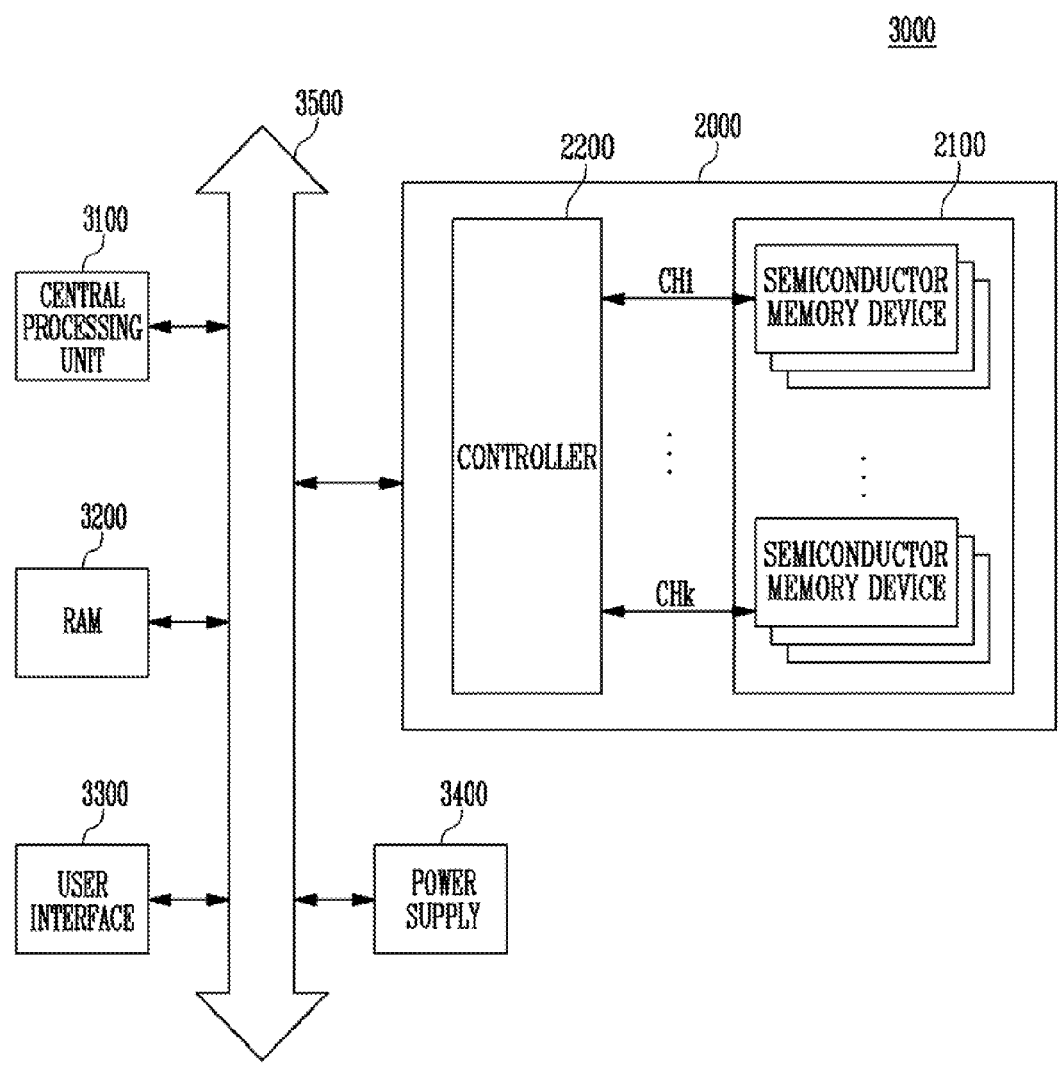
FIG. 13 is a block diagram illustrating a computing system including a memory system according to an embodiment.

FIG. 13 is a block diagram illustrating a computing system 3000 including the memory system 2000 described above with reference to FIG. 12.

Referring to FIG. 3, the computing system 3000 may include a central processing unit 3100, a Random Access Memory (RAM) 3200, a user interface 3300, a power supply 3400 a system bus 3500, and the memory system 2000.

The memory system 2000 may be electrically connected to the central processing unit 3100, the RAM 3200, the user interface 3300, and the power supply 3400 through the system bus 3500. Data provided through the user interface 3300 or data processed by the central processing unit 3100 may be stored in the memory system 2000.

FIG. 13 illustrates that the semiconductor memory device 2100 is coupled to the system bus 3500 through the controller 2200. However, the semiconductor memory device 2100 may be directly coupled to the system bus 3500. The functions of the controller 2200 may be performed by the central processing unit 3100 and the RAM 3200.

FIG. 13 illustrates that the memory system 2000 described above with reference to FIG. 12 is provided. However, the memory system 2000 may be replaced by the memory system 10 described above with reference to FIG. 1. According to an embodiment, the computing system 3000 may include the memory systems 10 and 2000 described above with FIGS. 1 and 12.

According to an embodiment, a read command may be mirrored before the read command transferred to the semiconductor memory device. Therefore, when error correction fails, mirrored command may be provided. Therefore, a memory system having an improved operating speed may be provided.

According to an embodiment, a controller having an improved operating speed and an operating method thereof may be provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A controller for controlling a semiconductor memory device including a plurality of pages, the controller comprising:
    a command generation unit suitable for generating a first read command for at least one page selected from said plurality of pages;
    an error correction block suitable for performing a first error correction operation to one or more code words stored in said at least one selected page in response to the first read command;
    a main command queue suitable for queueing and dequeuing the first read command, wherein the first read command is dequeued when the first error correction operation fails;
    a command mirroring unit suitable for generating a mirrored command by mirroring the first read command before the first error correction operation is performed, wherein the command mirroring unit includes a sub-command queue suitable for queueing and dequeuing a second read command which is generated by the mirrored command;
    a mirroring storage unit suitable for storing the mirrored command until error correction succeeds; and
    a command selection unit suitable for selecting the main command queue or the sub-command queue, and providing the first read command or the second read command to the semiconductor memory device,
    wherein the command minoring unit generates the second read command, which is the same as the mirrored command, on the basis of the mirrored command when the first error correction operation in response to the first read command fails,
    wherein the error correction block performs a second error correction operation to at least one of the one or more code words, for which the first error correction operation failed, in response to the second read command when the first error correction operation fails, and
    wherein generating the mirrored command before the first error correction operation is performed, and generating the second read command on the basis of the mirrored command when the first error correction operation fails, improves the operating speed of the controller.

2. The controller of claim 1, wherein the command mirroring unit is suitable for generating the second read command before the first read command is communicated to the semiconductor memory device.

3. The controller of claim 1, wherein the controller is suitable for communicating the second read command to the semiconductor memory device.

4. The controller of claim 1, wherein when error correction succeeds, the command generation unit provides error-corrected code words to a host.

5. The controller of claim 1, wherein
the main command queue queues and dequeues the first read command on a first-in-first-out (FIFO) basis, and the sub-command queue queues and dequeues the second read command on the FIFO basis.

6. The controller of claim 1, wherein the second read command is a read command for the selected page.

7. The controller of claim 1, wherein the second read command includes a series of sub-commands for one or more read-retry operations to at least one of said one or more code words to which the first error correction operation fails.

8. The controller of claim 1, wherein the second read command includes a series of sub-commands for one or more soft decision operations to at least one of said one or more code words to which the first error correction operation fails.

9. The controller of claim 1, further comprising a memory control unit suitable for providing the first and second read commands to the semiconductor memory device and receiving the code words corresponding to the first read and second read commands from the semiconductor memory device, respectively.

10. A method for operating a controller for controlling a semiconductor memory device including a plurality of pages, the method comprising:
generating a first read command for at least one page selected from said plurality of pages;
generating a mirrored command by mirroring the first read command when the first read command is generated;
storing the mirrored command into a mirroring storage;
performing a first error correction operation to at least one or more code words stored in the selected page in response to the first read command;
dequeuing the first read command when the first error correction operation fails;
generating a second read command on the basis of the mirrored command when the first error correction operation fails, wherein the second read command is the same as the mirrored command; and
performing a second error correction operation to at least one of the one or more code words, for which the first error correction operation failed, on the basis of the second read command when the first error correction operation fails, and
wherein generating the mirrored command when the first read command is generated before the first error correction operation is performed, and generating the second read command on the basis of the mirrored command when the first error correction operation fails, improves the operating speed of the controller.

11. The method of claim 10, further comprising providing error-corrected code words to a host when error correction operation succeeds.

12. The method of claim 10, further comprising canceling the mirrored command when the first error correction operation to each of the one or more code words succeeds.

13. The method of claim 10, wherein the second read command is a read command for the selected page.

14. The method of claim 10, wherein the second read command includes a series of sub-commands for one or more read-retry operations to at least one of said one or more code words to which the first error correction operation fails.

15. The method of claim 10, wherein the second read command includes a series of sub-commands for one or more soft decision operations to at least one of said one or more code words to which the first error correction operation fails.

16. A memory system, comprising:
a semiconductor memory device including a plurality of pages; and
a controller controlling the semiconductor memory device,
wherein the controller comprises:
an error correction block suitable for performing a first error correction operation to each of code words stored in a selected page in response to a first read command;
a main command queue suitable for queueing and dequeuing the first read command, wherein the first read command is dequeued when the first error correction operation fails;
a command mirroring unit suitable for generating a mirrored command by mirroring the first read command before the first error correction operation is performed, wherein the command minoring unit includes a sub-command queue suitable for queueing and dequeuing a second read command which is generated by the mirrored command;
a mirroring storage unit suitable for storing the mirrored command until error correction succeeds; and
a command selection unit suitable for selecting the main command queue or the sub-command queue, and providing the first read command or the second read command to the semiconductor memory device,
wherein the command minoring unit generates the second read command, which is the same as the mirrored command, on the basis of the mirrored command when the first error correction operation in response to the first read command fails,
wherein the error correction block performs a second error correction operation to at least one of the one or more code words, for which the first error correction operation failed, in response to the second read command when the first error correction operation fails, and
wherein generating the mirrored command before the first error correction operation is performed, and generating the second read command on the basis of the mirrored command when the first error correction operation fails, improves the operating speed of the controller.

* * * * *